United States Patent
Yu (10) Patent No.: US 7,723,150 B2
(45) Date of Patent: May 25, 2010

(54) IMAGE SENSOR AND FABRICATING METHOD THEREOF

(75) Inventor: Cheng-Hung Yu, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 83 days.

(21) Appl. No.: 12/147,940

(22) Filed: Jun. 27, 2008

(65) Prior Publication Data

US 2009/0321862 A1    Dec. 31, 2009

(51) Int. Cl.
*H01L 21/00* (2006.01)

(52) U.S. Cl. .................. 438/70; 438/199; 438/513; 257/E21.17; 257/E21.218; 257/E21.229; 257/E21.245; 257/E21.352; 257/E21.527; 257/E21.632

(58) Field of Classification Search .................. 438/70, 438/199, 513, 637, 680, 700, 706, 782; 257/288, 257/292, 417, 291, 72

See application file for complete search history.

(56) References Cited

U.S. PATENT DOCUMENTS

| | | | | |
|---|---|---|---|---|
| 5,849,605 A | * | 12/1998 | Yamada | 438/60 |
| 6,720,595 B2 | * | 4/2004 | Clevenger et al. | 257/292 |
| 7,041,525 B2 | * | 5/2006 | Clevenger et al. | 438/48 |
| 7,268,009 B2 | * | 9/2007 | Hwang | 438/70 |
| 7,589,388 B2 | * | 9/2009 | Morita et al. | 257/448 |

* cited by examiner

*Primary Examiner*—David Nhu
(74) *Attorney, Agent, or Firm*—Winston Hsu (57) ABSTRACT

A method for fabricating an image sensor, which includes the following steps, is provided. A semiconductor substrate including a sensor array, a pad and a passivation layer is provided, and the passivation layer covers the sensor array and the pad. An opening, which comprises tapered sidewalls not perpendicular to a bared surface of the pad, is formed in the semiconductor substrate to expose the pad. An under layer is formed on the semiconductor substrate, and covers the pad and the passivation layer. A color filter array is formed on the under layer and over the corresponding sensor array. A planar layer is formed on the color filter array. A portion of the under layer is removed to expose the pad. A plurality of U-lenses is formed on the planar layer.

20 Claims, 7 Drawing Sheets

IMAGE SENSOR AND FABRICATING METHOD THEREOF

BACKGROUND OF THE INVENTION

1. Field of the Invention

The present invention relates to a semiconductor device and a fabricating method thereof, and particularly relates to an image sensor and a fabricating method thereof.

2. Description of Related Art

An image sensor is an electronic device, which converts optical information into electrical signals. Image sensors are roughly divided into two different categories, Cathode Ray Tube (CRT) and fixed photograph device. CRT is mainly applied in television (TV) and widely used for applying image processing techniques in measuring, controlling, and recognizing application techniques. At present, there are two types of fixed photograph devices, including a charged coupled device (CCD) and a complementary metal-oxide-semiconductor (CMOS).

A complementary metal-oxide-semiconductor (CMOS) image sensor is a device, which converts optical images into electrical signals through CMOS fabricating technique. Compared with a CCD image sensor which has been widely used, a CMOS image sensor has the advantages of simple driving method, various scanning methods, single-chip signal processing circuit, lower production costs, and lower power consumption. For the above advantages, CMOS image sensors become more widely applied than CCD image sensors in recent years.

However, many problems still exist in the processes of fabricating CMOS image sensors, and they impair the quality of CMOS image sensors.

For instance, an opening which exposes a pad is formed before the formation of a color filter array (CFA) and U-lenses, so as to perform a wafer acceptable test. Succeeding fabricating processes will be performed after a wafer is tested. It is noted that, when a photoresist material is applied to form the color filter array, the opening exposing the pad will cause the uneven coating or residuals of the photoresist material, which reduces the image quality of the CMOS image sensor.

In addition, the color filter array is generally formed on a silicon nitride passivation layer. However, the adhesion between the silicon nitride passivation layer and the color filter array formed by the photoresist material is not good enough and usually causes the peeling of color filter units in the color filter array. Furthermore, the developing process and the rework process for forming the color filter array both bring damage to the pad exposed by the opening.

SUMMARY OF THE INVENTION

Accordingly, the present invention provides a method for fabricating an image sensor, which effectively removes an under layer disposed on a pad.

The present invention further provides a method for fabricating an image sensor, which prevents the pad from damage.

The present invention further provides an image sensor, which prevents the peeling of a color filter array.

The present invention provides a method for fabricating an image sensor, comprising the following steps. First, a semiconductor substrate, which comprises a sensor array, a pad, and a passivation layer, is provided, and the passivation layer covers the sensor array and the pad. Next, an opening, which comprises tapered sidewalls not perpendicular to a bared surface of the pad, is formed in the semiconductor substrate to expose the pad. Then, an under layer is formed on the semiconductor substrate to cover the pad and the passivation layer. Thereafter, a color filter array is formed on the under layer and over the corresponding sensor array. Following that, a planar layer is formed on the color filter array. A portion of the under layer is then removed to expose the pad. Next, a plurality of U-lenses is formed on the planar layer.

According to the fabricating method in an embodiment of the present invention, a material of the passivation layer is, for example, oxide, nitride, carbide, nitrogen oxide or combination thereof.

According to the fabricating method in an embodiment of the present invention, a method for forming the opening is, for example, to perform an etching process.

According to the fabricating method in an embodiment of the present invention, an etching gas of the etching process comprises at least one selected from a group of $C_4H_8$, $C_2F_6$, $C_2F_8$, $CHF_3$, $CH_3F$, and $CH_2F_2$.

According to the fabricating method in an embodiment of the present invention, the etching gas of the etching process further comprises at least one selected from a group of CO, $H_2$, $CH_4$, and Ar.

According to the fabricating method in an embodiment of the present invention, a material of the under layer is, for example, a non-photosensitive organic material.

According to the fabricating method in an embodiment of the present invention, the non-photosensitive organic material comprises one or a combination of at least two selected from ethyl-3-ethoxy propionate (EEP), propylene glycol monomethyl ether acetate (PGMEA), acrylic resin, and multi-functional acrylic monomers, for example.

According to the fabricating method in an embodiment of the present invention, a method for removing the portion of the under layer is, for example, to perform a de-scum process.

The present invention further provides a method for fabricating an image sensor, comprising the following steps. First, a semiconductor substrate, which comprises a sensor array, a pad, and a passivation layer, is provided, and the passivation layer covers the sensor array and the pad. Next, an opening, which comprises tapered sidewalls not perpendicular to a bared surface of the pad, is formed in the semiconductor substrate to expose the pad. Then, an under layer is formed on the semiconductor substrate to cover the pad and the passivation layer. Thereafter, a color filter array is formed on the under layer and over the corresponding sensor array. Following that, a planar layer is formed on the color filter array. Furthermore, a plurality of U-lenses is formed on the planar layer. Next, a cap layer is formed on the semiconductor substrate to cover the U-lenses, the planar layer, and the under layer. Thereafter, a portion of the cap layer and a portion of the under layer are removed to expose the pad.

According to the fabricating method in another embodiment of the present invention, a material of the passivation layer is, for example, oxide, nitride, carbide, nitrogen oxide or combination thereof.

According to the fabricating method in another embodiment of the present invention, a method for forming the opening is, for example, to perform an etching process.

According to the fabricating method in another embodiment of the present invention, an etching gas of the etching process comprises at least one selected from a group of $C_4H_8$, $C_2F_6$, $C_2F_8$, $CHF_3$, $CH_3F$, and $CH_2F_2$.

According to the fabricating method in another embodiment of the present invention, the etching gas of the etching process further comprises at least one selected from a group of CO, $H_2$, $CH_4$, and Ar.

According to the fabricating method in another embodiment of the present invention, a material of the under layer is, for example, a non-photosensitive organic material.

According to the fabricating method in another embodiment of the present invention, the non-photosensitive organic material comprises one or a combination of at least two selected from ethyl-3-ethoxy propionate (EEP), propylene glycol monomethyl ether acetate (PGMEA), acrylic resin, and multi-functional acrylic monomers, for example.

According to the fabricating method in another embodiment of the present invention, a method for removing the portion of the cap layer and the portion of the under layer is, for example, to perform a patterning process.

The present invention provides an image sensor, which comprises a semiconductor substrate, an under layer, a color filter array, a planar layer, and a plurality of U-lenses. The semiconductor substrate comprises a sensor array, a pad, and a passivation layer covering the sensor array. The semiconductor substrate has an opening, which has tapered sidewalls not perpendicular to a bared surface of the pad and exposes the pad. The under layer is disposed on the passivation layer. The color filter array is disposed on the under layer and over the corresponding sensor array. The planar layer is disposed on the color filter array. The U-lenses are disposed on the planar layer.

According to an embodiment of the present invention, the image sensor further comprises a cap layer disposed on the U-lenses and the planar layer.

According to an embodiment of the present invention, a material of the under layer of the image sensor is, for example, a non-photosensitive organic material.

According to an embodiment of the present invention, the non-photosensitive organic material of the image sensor comprises one or a combination of at least two selected from ethyl-3-ethoxy propionate (EEP), propylene glycol monomethyl ether acetate (PGMEA), acrylic resin, and multi-functional acrylic monomers, for example.

Based on the above, the fabricating method of the present invention provides an opening having tapered sidewalls not perpendicular to a bared surface of the pad so that an under layer formed on the sidewalls has a uniform thickness. Consequently, the under layer on the pad may an on the tapered sidewalls be effectively removed to prevent residual under layer on the pad and on the bottom of the tapered sidewalls.

In addition, according to the fabricating method of the present invention, the under layer is formed to protect the pad from damage caused by the developing process or the rework process during the formation of the color filter array.

Furthermore, in the image sensor of the present invention, the material of the under layer has better adhesion to the photoresist material of the color filter array. As a consequence, the peeling of the color filter array is prevented.

To make the above and other objects, features, and advantages of the present invention more comprehensible, embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
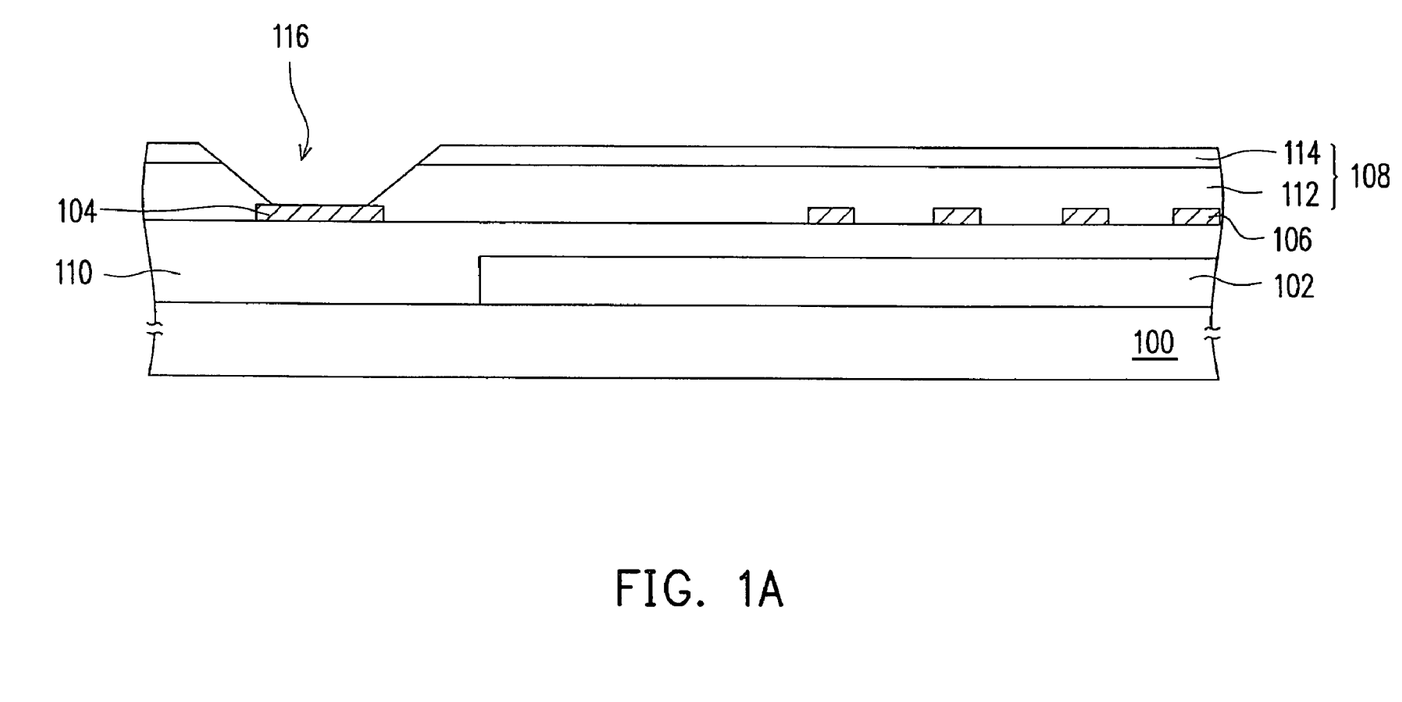
FIGS. 1A through 1C are schematic cross-sectional views illustrating a process flow for fabricating an image sensor according to an embodiment of the present invention.
Figure 1B:
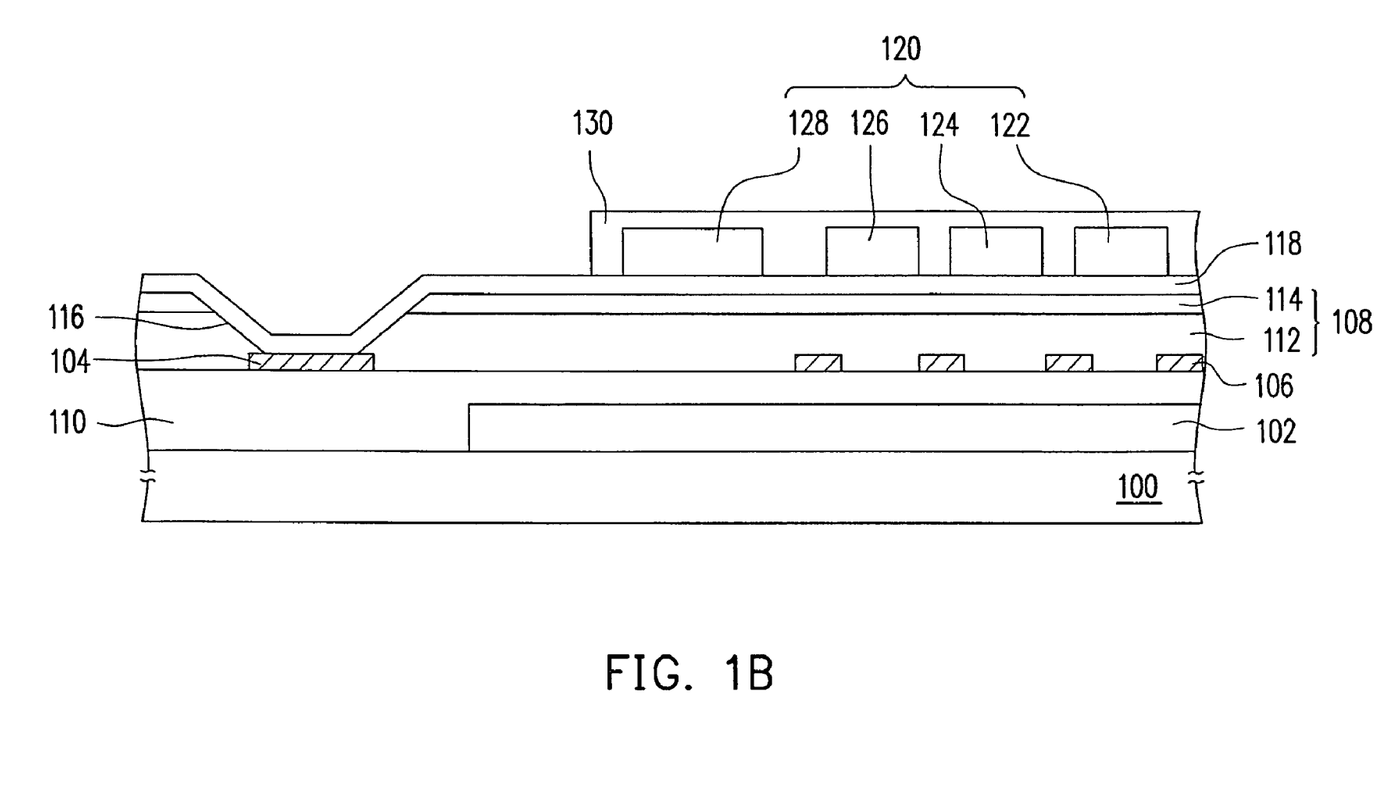
Figure 1C:
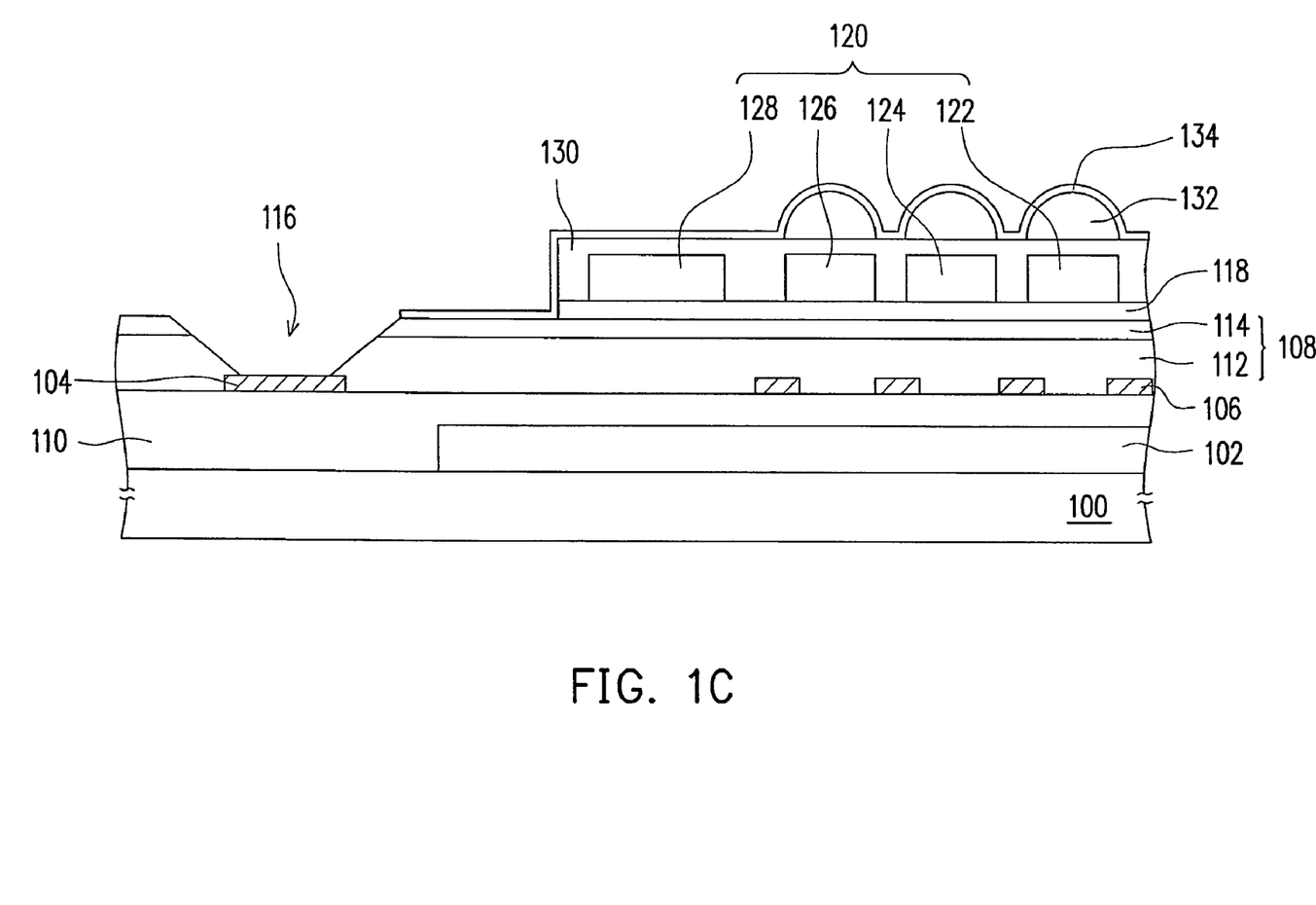

FIGS. 1A through 1C are schematic cross-sectional views illustrating a process flow for fabricating an image sensor according to an embodiment of the present invention.

First, referring to FIG. 1A, a semiconductor substrate 100, such as a silicon substrate, is provided. The semiconductor substrate 100 comprises a sensor array 102 (schematic diagram), a pad 104, a patterned metal layer 106, and a passivation layer 108.

The sensor array 102 is formed in a sensor array layer 110, for example. The sensor array 102 is formed by a plurality of photosensitive diodes (not shown), for example. The photosensitive diodes, for example, comprise CMOS transistors (not shown) and photosensitive areas (not shown), and the CMOS transistors and the photosensitive areas are electrically connected with each other.

The pad 104 and the patterned metal layer 106 are, for example, formed on the sensor array layer 110. The pad 104 is formed outside an area of the sensor array 102 for wiring. A material of the pad 104 comprises metal such as aluminum, and the pad 104 is formed by physical vapor deposition, for example. The patterned metal layer 106 is formed above the area of the sensor array 102 for blocking the scattering of an incident light. A material of the patterned metal layer 106 comprises metal such as aluminum, and the patterned metal layer 106 is formed by physical vapor deposition, for example.

The passivation layer 108 covers the sensor array 102, the pad 104, and the patterned metal layer 106. The passivation layer 108 is, for example, formed by an oxide layer 112 and a hard dielectric material layer 114. Herein, the oxide layer 112 provides an effect of planarization and is oxide, for example. The hard dielectric material layer 114 provides protection against moisture and stress and is oxide, nitride, carbide, nitrogen oxide or combination thereof, for example. The passivation layer 108 is, for example, formed by chemical vapor deposition.

Next, an opening 116, which comprises tapered sidewalls not perpendicular to a bared surface of the pad 104, is formed in the semiconductor substrate 100 to expose the pad 104. The higher slope of the tapered sidewalls is beneficial to improve the spin-coating uniformity of the photoresist for the color filter array, so that the striation could be reduced. The opening 116 is, for example, formed by performing a patterning process on the passivation layer 108. An etching process used in the patterning process is, for example, a dry etching process. The tapered sidewalls of the opening 116 are, for example, formed by varying an etching gas of the etching process. The etching gas comprises at least one selected from a group of $C_4H_8$, $C_2F_6$, $C_2F_8$, $CHF_3$, $CH_3F$, and $CH_2F_2$. In addition, the etching gas of the etching process may selectively further comprise at least one selected from a group of CO, $H_2$, $CH_4$, $O_2$ and Ar.

Then, referring to FIG. 1B, an under layer 118 is formed on the semiconductor substrate 100, and the under layer 118 covers the pad 104 and the passivation layer 108. The under layer 118 is, for example, formed by a photoresist-like material such as a non-photosensitive organic material, which may comprise one or a combination of at least two selected from ethyl-3-ethoxy propionate (EEP), propylene glycol monomethyl ether acetate (PGMEA), acrylic resin, and multi-functional acrylic monomers. The under layer 118 is, for example, formed by performing a spin coating process. In addition, if the under layer 118 is formed by a non-photosensitive organic material, a thickness of the under layer 118 would be effectively reduced to decrease the influence the under layer 118 brings to an incident light. In this embodiment, a thickness of the under layer 118 is, for example, 600 Å.

Thereafter, a color filter array 120 is formed on the under layer 118 and over the corresponding sensor array 102. The color filter array 120 comprises a red color filter unit 122, a green color filter unit 124, a blue color filter unit 126, and a black matrix 128, for example, or combination thereof. The color filter array 120 is, for example, formed by a negative photoresist material. A method for forming the units of the color filter array 120 is using well-known processes to persons having general knowledge in this area, for example, a photoresist spin-coating process, an alignment process, an exposure process and a development process etc., and a detailed description is therefore omitted herein.

Following that, a planar layer 130 is formed on the color filter array 120. The planar layer 130 is, for example, formed by a negative photoresist material. A method for forming the planar layer 130 is, for example, to spin-coat a planar material layer (not shown) and then use a mask to perform a photolithography process.

Then, referring to FIG. 1C, a portion of the under layer 118 is removed to expose the pad 104. The portion of the under layer 118 is, for example, removed by performing a de-scum process to remove the under layer 118 not covered by the mask which is the planar layer 130 and the color filter array 120. The de-scum process is performed by using an oxygen plasma at a low temperature of approximately 100° C., for example, therefore the planar layer 130 and the color filter array 120 could not be damaged. It is noted that because the opening 116 has tapered sidewalls, the under layer 118 on the sidewalls of the opening 116 has a uniform thickness. Thereby, residual under layer 118 on the bottom of the sidewalls caused by an uneven thickness of the under layer 118 during the formation of the under layer 118 is prevented.

Next, U-lenses 132 are formed on the planar layer 130 and formed over the corresponding color filter array 120 respectively. The U-lenses 132 are, for example, formed by a positive photoresist material. A method for forming the U-lenses 132 is, for example, to spin-coat a U-lenses material layer (not shown) and then use a mask to perform a photo-etching process and a high-temperature (about 190~200° C.) baking process to form arc lenses.

Thereafter, a cap layer 134 is formed on the U-lenses 132 and the planar layer 130. A material of the cap layer 134 is, for example, oxide, such as TEOS (tetraethyl orthosilicate), silicon oxide and spin-coating glass etc. A method for forming the cap layer 134 is, for example, to form a cap material layer (not shown) conformal covering all the chip by chemical vapor deposition and then perform a photolithography process and an etching process to re-open the cap material layer on the pad 104.

Based on the above embodiment, because the opening 116 exposing the pad 104 has the tapered sidewalls, the under layer 118 formed on the sidewalls has a uniform thickness. Consequently, the under layer 118 on the pad 104 may be completely removed to prevent residual under layer 118 on the pad 104.

In addition, the under layer 118 protects the pad 104 from damage caused by the developing process and the rework process during the formation of the color filter array 120.

Furthermore, the material of the under layer 118 has better adhesion to the photoresist material of the color filter array 120. Thereby, the peeling of the color filter array 120 is prevented.

Next, FIG. 1C illustrates an image sensor according to an embodiment of the present invention.

Referring to FIG. 1C, the image sensor comprises a semiconductor substrate 100, an under layer 118, a color filter array 120, a planar layer 130, U-lenses 132, and a cap layer 134. The semiconductor substrate 100 comprises a sensor array 102, a pad 104, a patterned metal layer 106, and a passivation layer 108. The semiconductor substrate 100 further comprises an opening 116, which has tapered sidewalls not perpendicular to a bared surface of the pad 104 and exposes the pad 104. The sensor array 102 is formed in a sensor array layer 110, for example. The pad 104 and the patterned metal layer 106 are, for example, formed on the sensor array layer 110. The passivation layer 108 covers the sensor array 102 and the patterned metal layer 106. The passivation layer 108 is, for example, formed by a oxide layer 112 and a hard dielectric material layer 114. The under layer 118 is disposed on the passivation layer 108. The color filter array 120 is disposed on the under layer 118 and over the corresponding sensor array 102. The color filter array 120 comprises a red color filter unit 122, a green color filter unit 124, a blue color filter unit 126, and a black matrix 128. The planar layer 130 is disposed on the color filter array 120. The U-lenses 132 are disposed on the planar layer 130. The cap layer 134 is disposed on the U-lenses 132 and the planar layer 130. The materials, dispositions, and functions of the elements of the image sensor in FIG. 1C have been described in the above paragraphs, and therefore a detailed description thereof is not repeated herein.

Based on the above, because the opening 116 exposing the pad 104 has the tapered sidewalls not perpendicular to a bared surface of the pad 104, the under layer 118 formed on the pad 104 may be completely removed to prevent residual under layer 118 on the pad 104.

In addition, the under layer 118 in the image sensor is adapted for improving the adhesion of the color filter array 120 so as to prevent the peeling of the color filter array 120.

FIGS. 2A through 2D are schematic cross-sectional views illustrating a process flow for fabricating an image sensor according to another embodiment of the present invention.

Figure 2A:
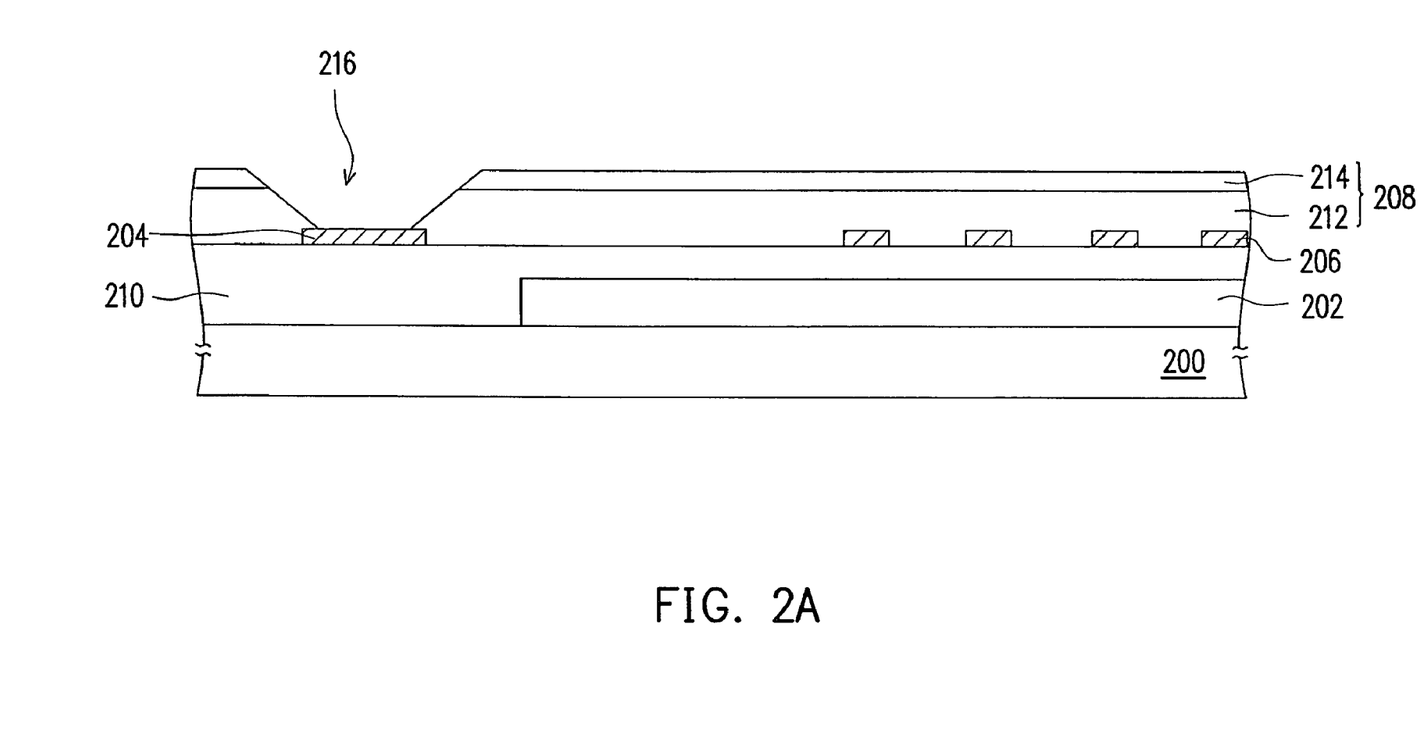
FIGS. 2A through 2D are schematic cross-sectional views illustrating a process flow for fabricating an image sensor according to another embodiment of the present invention.

First, referring to FIG. 2A, a semiconductor substrate 200, such as a silicon substrate, is provided. The semiconductor substrate 200 comprises a sensor array 202, a pad 204, a patterned metal layer 206, and a passivation layer 208. The sensor array 202 is formed in a sensor array layer 210, for example. The passivation layer 208 is, for example, formed by an oxide layer 212 and a hard dielectric material layer 214. The materials, dispositions, and functions of the elements of the semiconductor substrate 200 in FIG. 2A are approximately the same as those of the semiconductor substrate 100 in FIG. 1A, and a detailed description is therefore omitted herein.

Then, an opening 216, which comprises tapered sidewalls not perpendicular to a bared surface of the pad 204, is formed in the semiconductor substrate 200 to expose the pad 204. The opening 216 is, for example, formed by performing a patterning process on the passivation layer 208. An etching process used in the patterning process is, for example, a dry etching process. The tapered sidewalls of the opening 216 are, for example, formed by varying an etching gas of the etching process. The etching gas comprises at least one selected from a group of $C_4H_8$, $C_2F_6$, $C_2F_8$, $CHF_3$, $CH_3F$, and $CH_2F_2$. In addition, the etching gas of the etching process may selectively further comprise at least one selected from a group of CO, H₂, CH₄, O₂ and Ar.

Figure 2B:
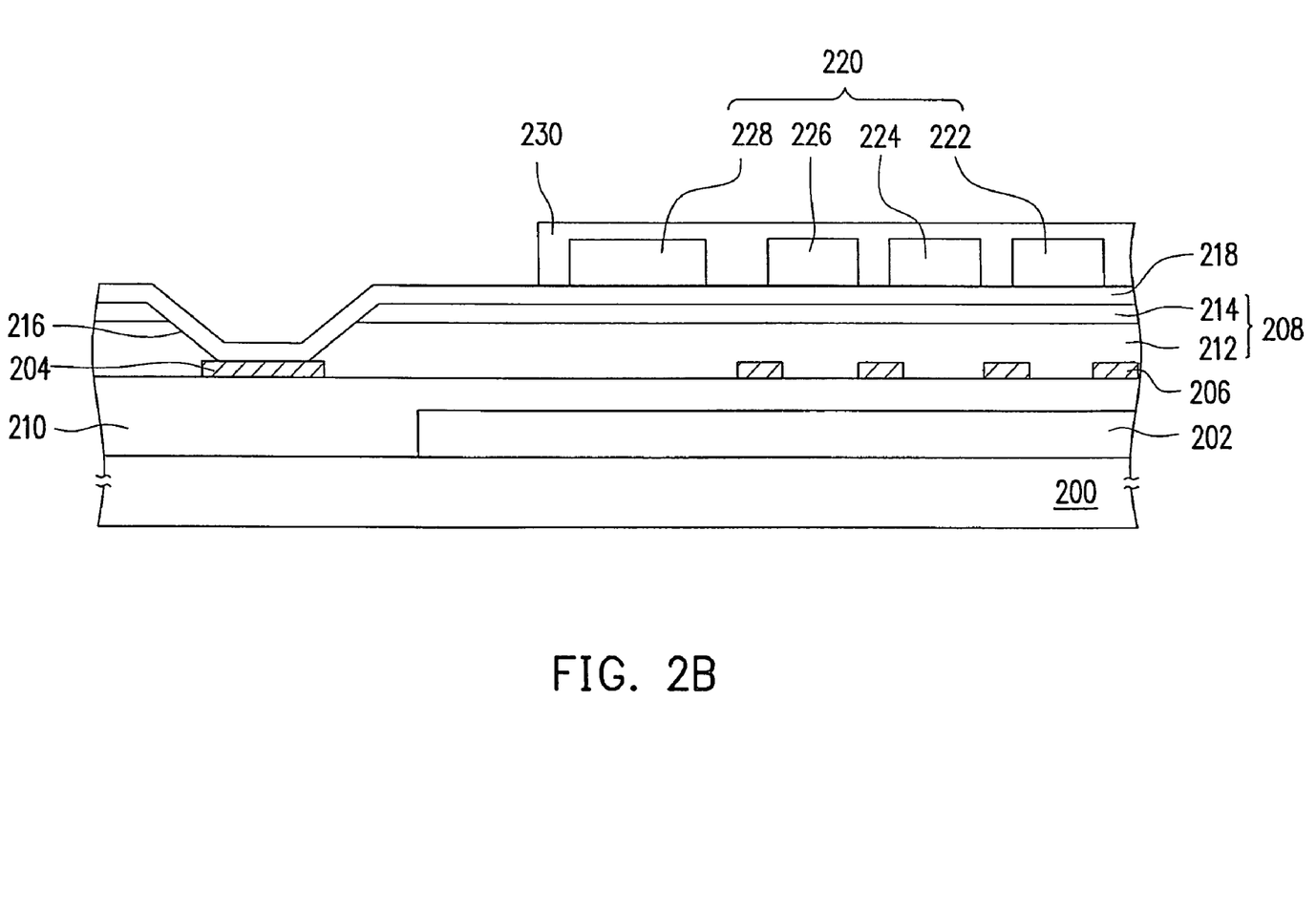

Next, referring to FIG. 2B, an under layer 218 is formed on the semiconductor substrate 200, and the under layer 218 covers the pad 204 and the passivation layer 208. The under layer 218 is, for example, formed by a photoresist-like material such as a non-photosensitive organic material, which may comprise one or a combination of at least two selected from ethyl-3-ethoxy propionate (EEP), propylene glycol monomethyl ether acetate (PGMEA), acrylic resin, and multi-functional acrylic monomers. The under layer 218 is, for example, formed by performing a spin coating process. In addition, If the under layer 218 is formed by a non-photosensitive organic material, a thickness of the under layer 218 would be effectively reduced to decrease the influence the under layer 218 brings to an incident light. In this embodiment, a thickness of the under layer 218 is, for example, 600 Å.

Thereafter, a color filter array 220 is formed on the under layer 218 and over the corresponding sensor array 202. The color filter array 220 comprises a red color filter unit 222, a green color filter unit 224, a blue color filter unit 226, and a black matrix 228. The color filter array 220 is, for example, formed by a negative photoresist material. A method for forming the color filter array 220 is well-known to persons having general knowledge in this area, for example, a photoresist spin-coating process, an alignment process, an exposure process and a development process etc., and a detailed description is therefore omitted herein.

Following that, a planar layer 230 is formed on the color filter array 220. The planar layer 230 is, for example, formed by a negative photoresist material. A method for forming the planar layer 230 is, for example, to spin-coat a planar material layer (not shown) and then uses a mask to perform a photolithography process.

Figure 2C:
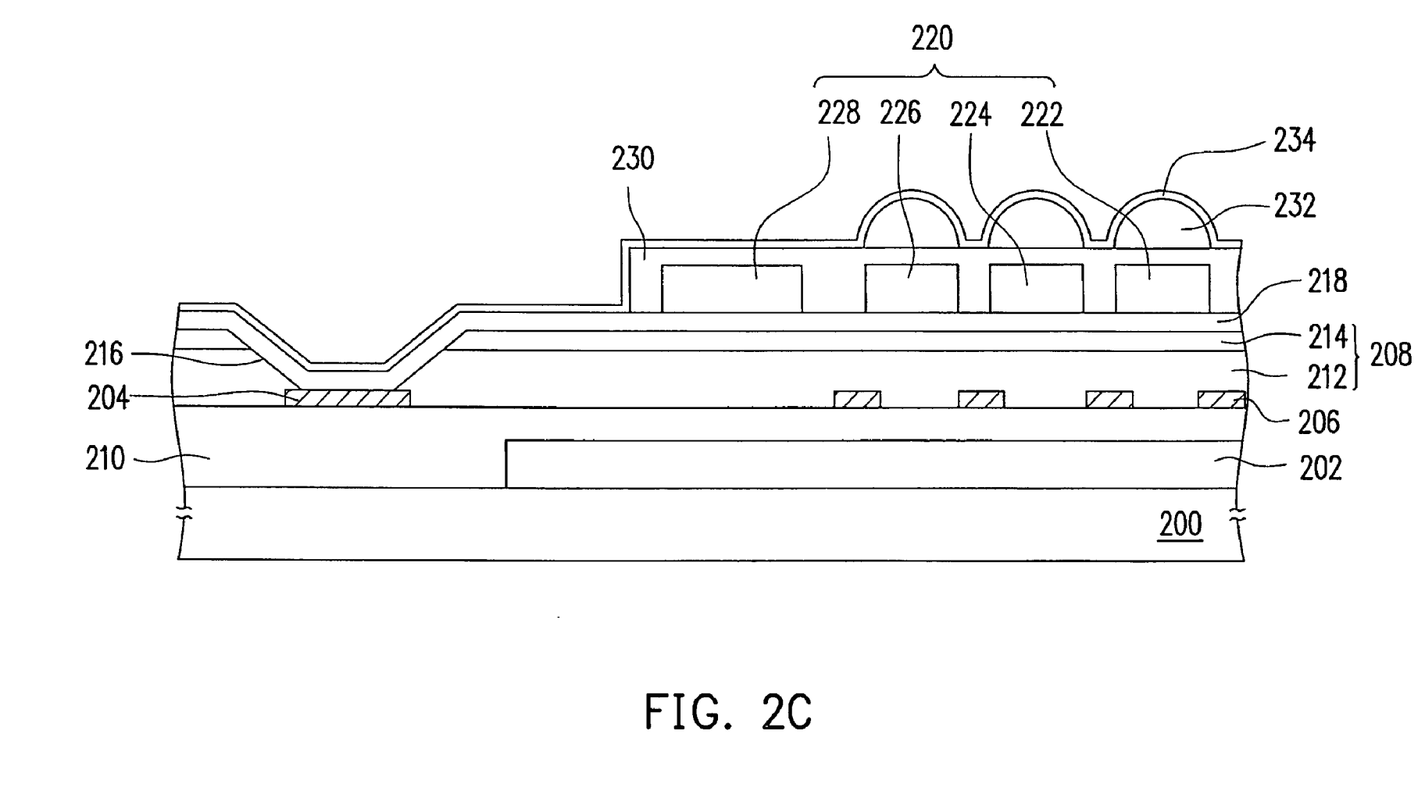

Next, referring to FIG. 2C, U-lenses 232 are formed on the planar layer 230 and formed over the corresponding color filter array 220 respectively. The U-lenses 232 are, for example, formed by a positive photoresist material. A method for forming the U-lenses 232 is, for example, to spin-coat a U-lenses material layer (not shown) and then use a mask to perform a photolithography process and a high-temperature (about 190~200° C.) baking process to form arc lenses.

Thereafter, a cap layer 234 is formed on the semiconductor substrate, and the cap layer 234 covers the U-lenses 232, the planar layer 230, and the under layer 218. The cap layer 234 is, for example, formed by oxide, such as TEOS, silicon oxide and spin-coating glass etc. The cap layer 234 is, for example, formed by chemical vapor deposition.

Figure 2D:
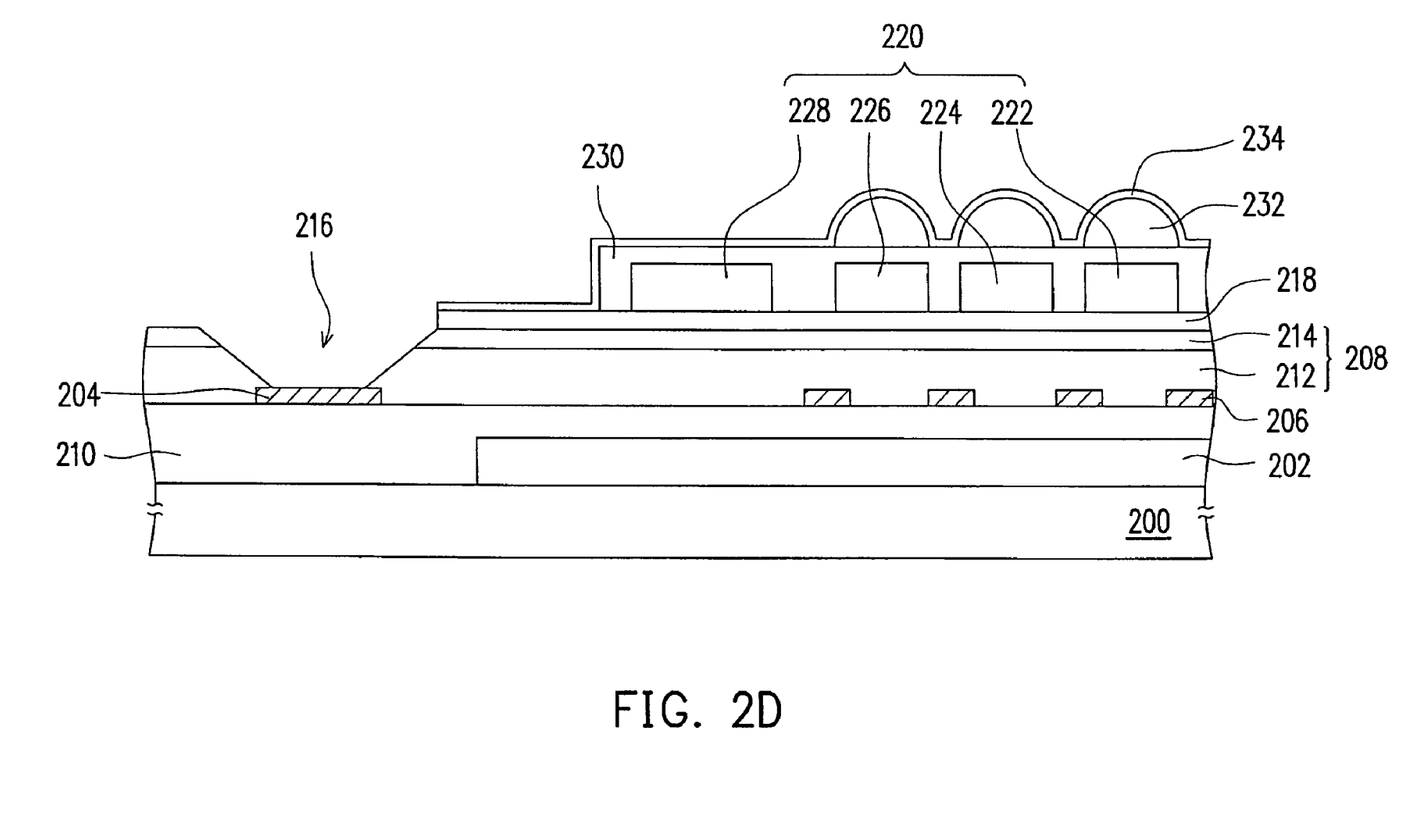

Then, referring to FIG. 2D, a portion of the cap layer 234 and a portion of the under layer 218 are removed to expose the pad 204. A method for removing the portion of the cap layer 234 and the portion of the under layer 218 is, for example, to perform a photolithography process and an etching process to re-open the cap layer 234. and the under layer 218 on the pad 204.

Based on the above embodiment, because the opening 216 exposing the pad 204 has the tapered sidewalls, the under layer 218 formed on the sidewalls has a uniform thickness. Consequently, the under layer 218 on the pad 204 may be completely removed to prevent residual under layer 218 on the pad 204.

In addition, the under layer 218 is adapted for protecting the pad 204 from damage caused by the developing process and the rework process during the formation of the color filter array 220.

Furthermore, the material of the under layer 218 has better adhesion to the photoresist material of the color filter array 220. As a consequence, the peeling of the color filter array 220 is prevented.

In summary, the above embodiments have at least the following advantages:

1. The method for fabricating an image sensor according to the present invention can prevent the residual under layer on the pad.
2. The method for fabricating an image sensor according to the present invention can protect the pad from damage.
3. The image sensor according to the present invention can effectively prevent the peeling of the color filter array.

Although the present invention has been disclosed by the above embodiments, the present invention is not limited thereto. Persons skilled in the art may make some modifications and alterations without departing from the spirit and scope of the present invention. Hence, the protection range of the present invention falls in the appended claims.

What is claimed is:

1. A method for fabricating an image sensor, comprising:
providing a semiconductor substrate, comprising a sensor array, a pad, and a passivation layer, and the passivation layer covering the sensor array and the pad;
forming an opening, comprising tapered sidewalls not perpendicular to a bared surface of the pad, in the semiconductor substrate to expose the pad;
forming an under layer on the semiconductor substrate to cover the pad and the passivation layer;
forming a color filter array on the under layer and over the corresponding sensor array;
forming a planar layer on the color filter array;
removing a portion of the under layer to expose the pad; and
forming a plurality of U-lenses on the planar layer.

2. The method for fabricating an image sensor according to claim 1, wherein a material of the passivation layer comprises oxide, nitride, carbide, nitrogen oxide or combination thereof.

3. The method for fabricating an image sensor according to claim 1, wherein a method for forming the opening comprises performing an etching process.

4. The method for fabricating an image sensor according to claim 3, wherein an etching gas of the etching process comprises at least one selected from a group of $C_4H_8$, $C_2F_6$, $C_2F_8$, $CHF_3$, $CH_3F$, and $CH_2F_2$.

5. The method for fabricating an image sensor according to claim 4, wherein the etching gas of the etching process further comprises at least one selected from a group of CO, $H_2$, $CH_4$, $O_2$ and Ar.

6. The method for fabricating an image sensor according to claim 1, wherein a material of the under layer comprises a non-photosensitive organic material.

7. The method for fabricating an image sensor according to claim 6, wherein the non-photosensitive organic material comprises one or a combination of at least two selected from ethyl-3-ethoxy propionate (EEP), propylene glycol monomethyl ether acetate (PGMEA), acrylic resin, and multi-functional acrylic monomers.

8. The method for fabricating an image sensor according to claim 1, wherein a method for removing the portion of the under layer comprises performing a descum process.

9. A method for fabricating an image sensor, comprising:
providing a semiconductor substrate, comprising a sensor array, a pad, and a passivation layer, and the passivation layer covering the sensor array and the pad;

forming an opening, comprising tapered sidewalls not perpendicular to a bared surface of the pad, in the semiconductor substrate to expose the pad;

forming an under layer on the semiconductor substrate to cover the pad and the passivation layer;

forming a color filter array on the under layer and over the corresponding sensor array;

forming a planar layer on the color filter array;

forming a plurality of U-lenses on the planar layer;

forming a cap layer on the semiconductor substrate to cover the U-lenses, the planar layer, and the under layer; and removing a portion of the cap layer and a portion of the under layer to expose the pad.

10. The method for fabricating an image sensor according to claim 9, wherein a material of the passivation layer comprises oxide, nitride, carbide, nitrogen oxide or combination thereof.

11. The method for fabricating an image sensor according to claim 9, wherein a method for forming the opening comprises performing an etching process.

12. The method for fabricating an image sensor according to claim 9, wherein an etching gas of the etching process comprises at least one selected from a group of $C_4H_8$, $C_2F_6$, $C_2F_8$, $CHF_3$, $CH_3F$, and $CH_2F_2$.

13. The method for fabricating an image sensor according to claim 12, wherein the etching gas of the etching process further comprises at least one selected from a group of CO, $H_2$, $CH_4$, and Ar.

14. The method for fabricating an image sensor according to claim 9, wherein a material of the under layer comprises a non-photosensitive organic material.

15. The method for fabricating an image sensor according to claim 14, wherein the non-photosensitive organic material comprises one or a combination of at least two selected from ethyl-3-ethoxy propionate (EEP), propylene glycol monomethyl ether acetate (PGMEA), acrylic resin, and multi-functional acrylic monomers.

16. The method for fabricating an image sensor according to claim 9, wherein a method for removing the portion of the cap layer and the portion of the under layer comprises performing a patterning process.

17. An image sensor, comprising:

a semiconductor substrate, comprising a sensor array, a pad, and a passivation layer covering the sensor array, and the semiconductor substrate comprising an opening having tapered sidewalls not perpendicular to a bared surface of the pad and exposing the pad;

an under layer disposed on the passivation layer;

a color filter array disposed on the under layer and over the corresponding sensor array;

a planar layer disposed on the color filter array; and a plurality of U-lenses disposed on the planar layer.

18. The image sensor as claimed in claim 17, further comprising a cap layer disposed on the U-lenses and the planar layer.

19. The image sensor as claimed in claim 17, wherein a material of the under layer comprises a non-photosensitive organic material.

20. The image sensor as claimed in claim 19, wherein the non-photosensitive organic material comprises one or a combination of at least two selected from ethyl-3-ethoxy propionate (EEP), propylene glycol monomethyl ether acetate (PGMEA), acrylic resin, and multi-functional acrylic monomers.

* * * * *